United States Patent [19]
Mizouchi

[11] Patent Number: 5,991,088
[45] Date of Patent: Nov. 23, 1999

[54] ILLUMINATION SYSTEM AND EXPOSURE APPARATUS

[75] Inventor: Satoru Mizouchi, Utsunomiya, Japan

[73] Assignee: Canon Kabushiki Kaisha, Tokyo, Japan

[21] Appl. No.: 08/865,637

[22] Filed: May 29, 1997

[30] Foreign Application Priority Data

Jun. 4, 1996 [JP] Japan ................................. 8-163891

[51] Int. Cl.⁶ ............................. G02B 3/00; G02B 15/14; G03B 27/42; G03B 21/14
[52] U.S. Cl. ......................... 359/649; 359/650; 359/651; 359/683; 355/53; 353/38; 362/268
[58] Field of Search ................... 359/649–651, 359/683; 355/53; 353/38; 362/268

[56] References Cited

U.S. PATENT DOCUMENTS

| | | | |
|---|---|---|---|
| 3,552,832 | 1/1971 | Demaine | 359/649 |
| 4,027,944 | 6/1977 | Gottlieb | 359/389 |
| 4,595,263 | 6/1986 | Clarke | 359/650 |
| 4,872,748 | 10/1989 | Braat | 359/716 |
| 4,906,080 | 3/1990 | Omata | 359/708 |
| 4,947,030 | 8/1990 | Takahashi | 250/201.1 |
| 4,988,188 | 1/1991 | Ohta | 353/122 |
| 5,016,994 | 5/1991 | Braat | 359/650 |
| 5,555,479 | 9/1996 | Nakagiri | 359/651 |
| 5,675,401 | 10/1997 | Wangler et al. | 355/67 |
| 5,745,297 | 4/1998 | Kaneko et al. | 359/651 |
| 5,805,344 | 9/1998 | Sasaya et al. | 359/651 |

FOREIGN PATENT DOCUMENTS

| | | |
|---|---|---|
| 0 687 956 | 12/1995 | European Pat. Off. . |
| 4-13686 | 11/1986 | Japan . |
| 4-367213 | 12/1992 | Japan . |
| 6-331941 | 12/1994 | Japan . |
| 6-331942 | 12/1994 | Japan . |
| 9-36026 | 2/1997 | Japan . |

*Primary Examiner*—Georgia Epps
*Assistant Examiner*—Evelyn A. Lester
*Attorney, Agent, or Firm*—Fitzpatrick, Cella, Harper & Scinto

[57] ABSTRACT

An illumination system includes a light source and an optical system for projecting light from the light source to a surface to be illuminated, wherein the optical system includes an optical element having a paraxial power of substantially zero and having an aspherical surface, and the optical element is movable along an optical axis when an illuminance distribution on the surface to be illuminated is to be changed.

24 Claims, 10 Drawing Sheets

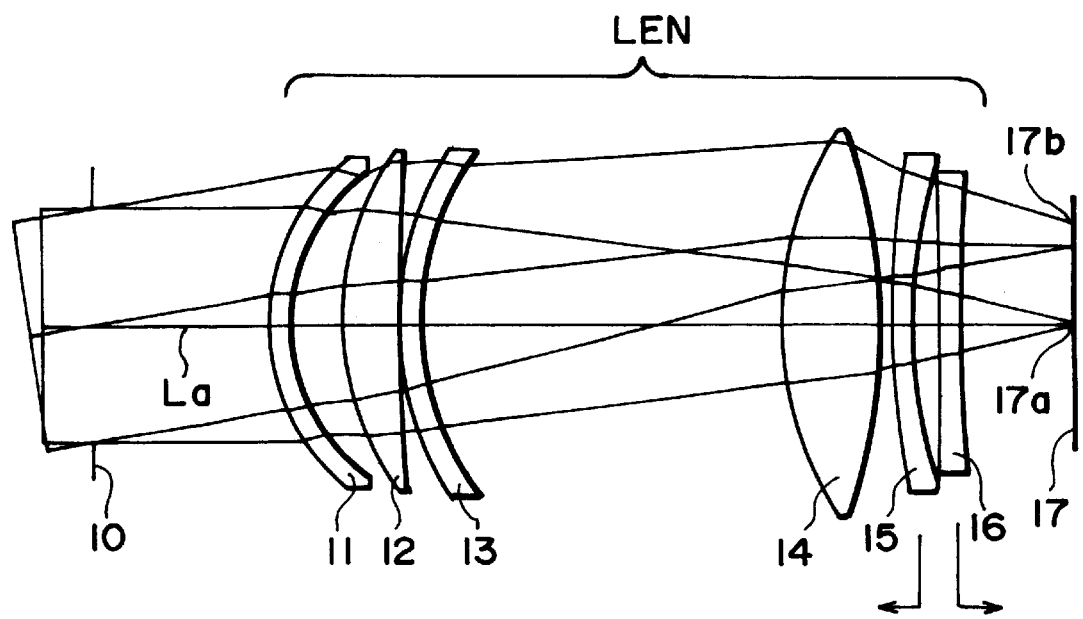
F I G. 1
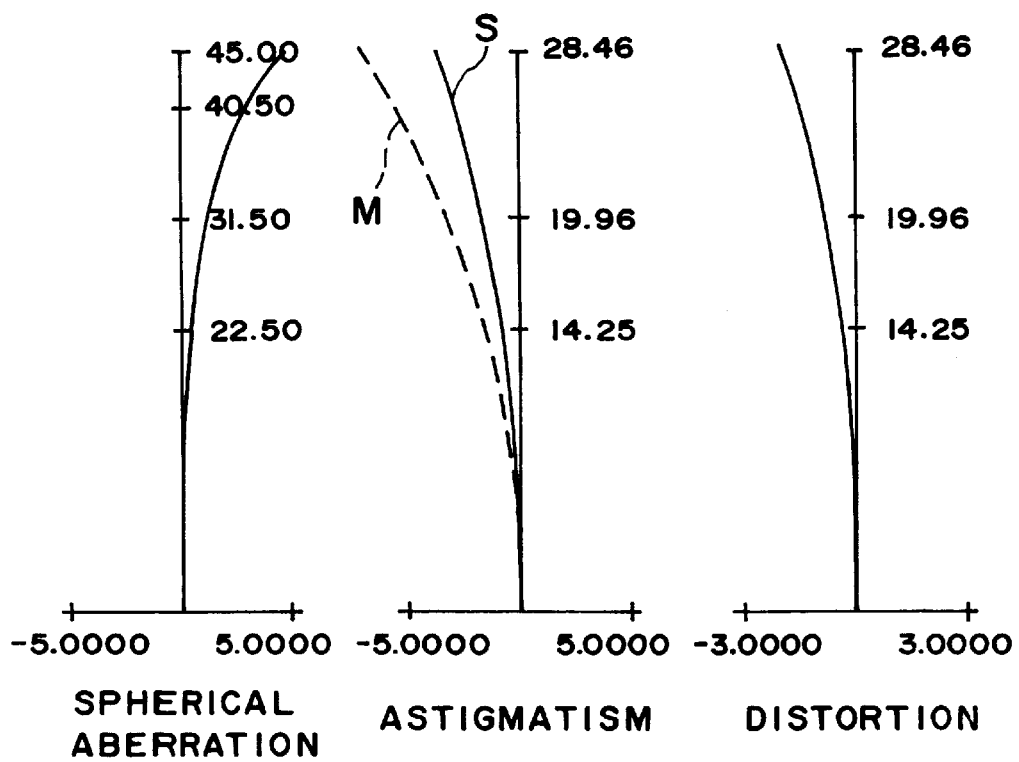
F I G. 2

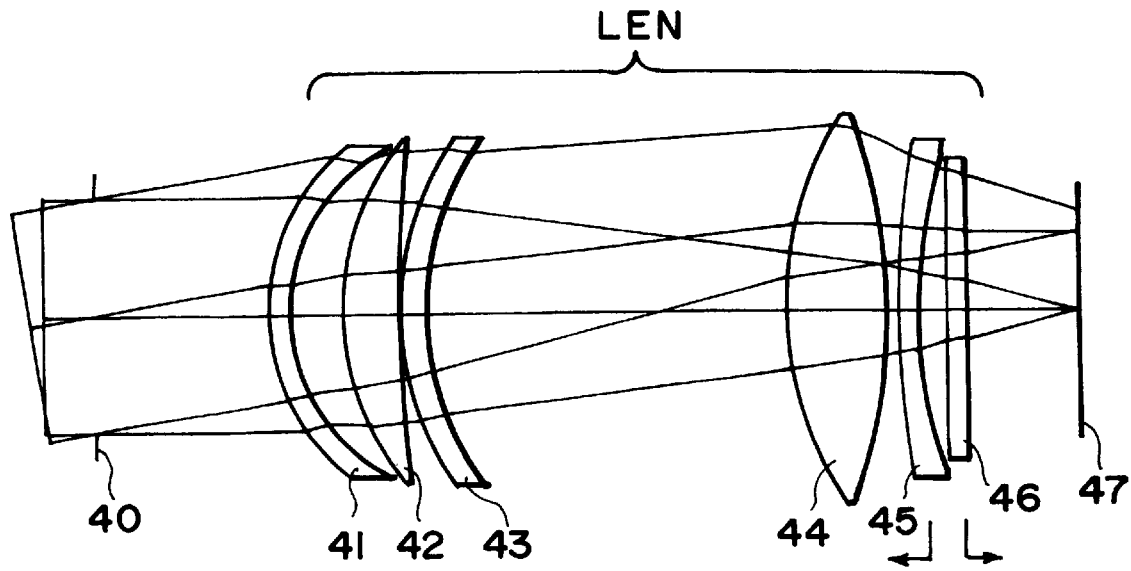
F I G. 7
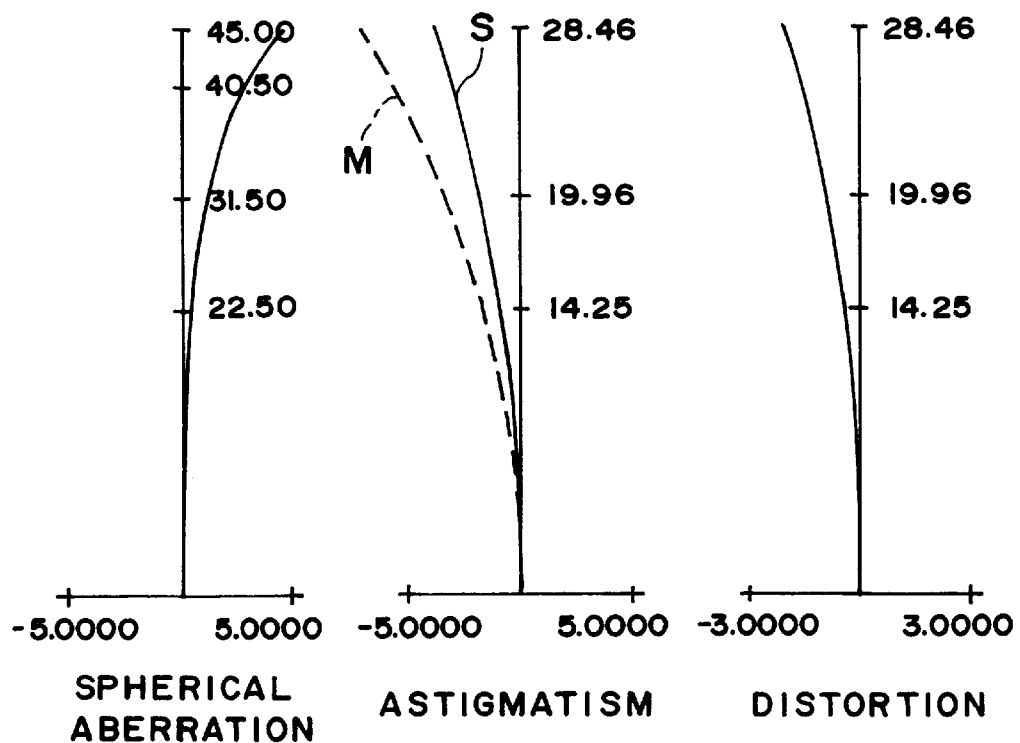
F I G. 8

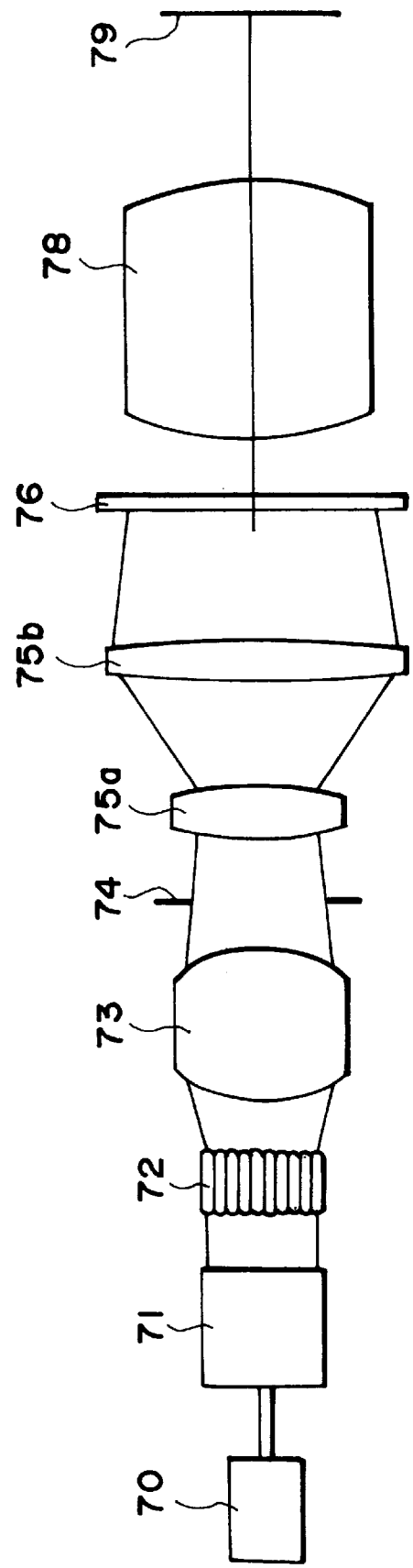
F I G. 12

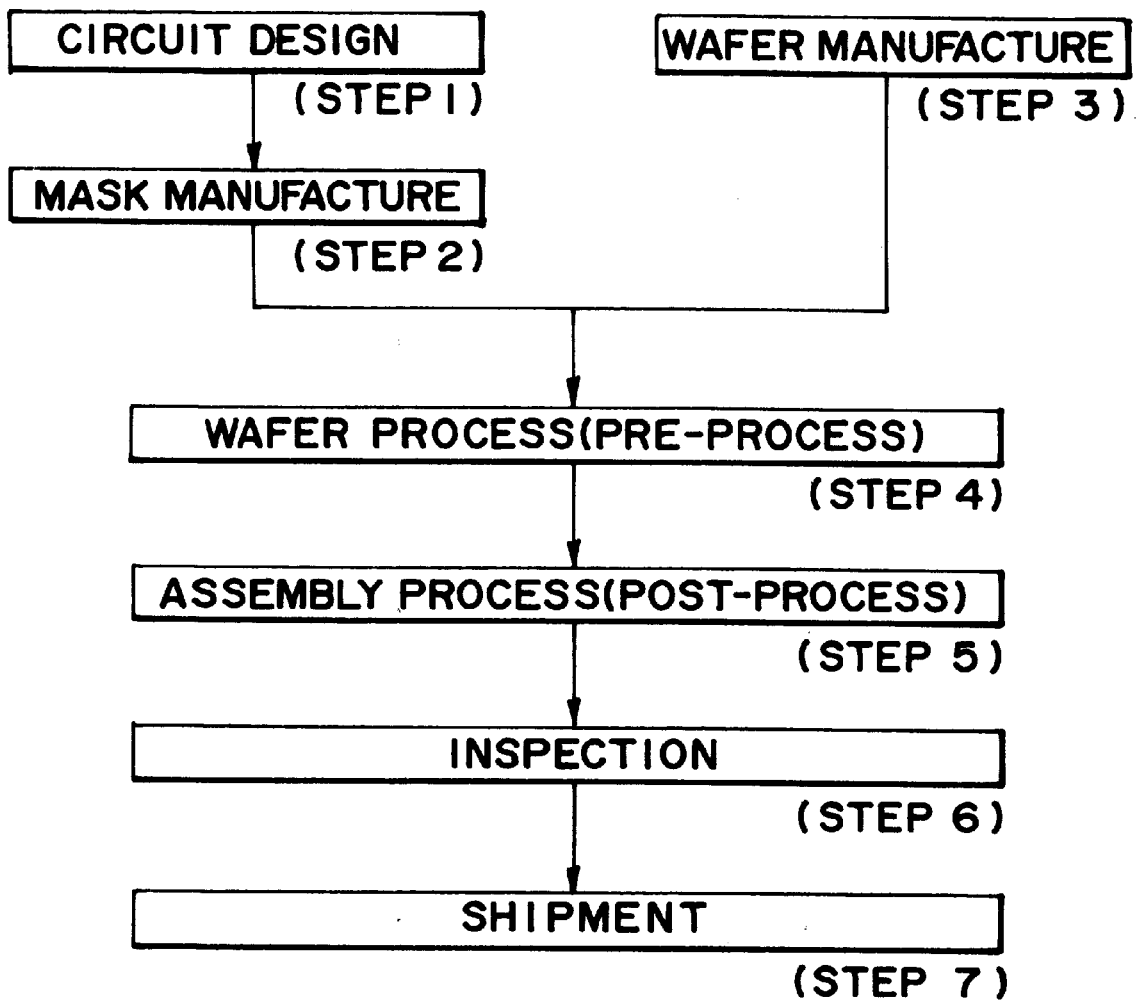
F I G. 13

ILLUMINATION SYSTEM AND EXPOSURE APPARATUS

FIELD OF THE INVENTION AND RELATED ART

This invention relates to an illumination system and an exposure apparatus using the same. More particularly, the invention is concerned with an illumination system and an exposure apparatus for use in the manufacture of semiconductor devices, for example, such as ICs or LSIs, wherein, when an electronic circuit pattern formed on the surface of a reticle (first object) is projected onto the surface of a wafer (second object) through a projection optical system, various components of an illumination optical system for illuminating the surface of the reticle are appropriately arranged to suitably control an illuminance distribution on the reticle surface, thereby to assure formation of a desired image of the circuit pattern upon the wafer surface.

In exposure apparatuses for the manufacture of semiconductor devices, there is a type called a stepper (projection exposure apparatus). In such a stepper, a reticle having an electronic circuit pattern formed thereon is illuminated with light from an illumination optical system, and the circuit pattern on the reticle surface is projected by a projection lens onto the surface of a wafer in a reduced scale, whereby the circuit pattern image is printed thereon. In such exposure apparatuses, the quality of an image transferred onto the wafer largely depends on the performance of the illumination optical system, such as, for example, the uniformness of the illuminance distribution upon the surface being illuminated (such as the surface of a reticle).

An illumination system having an arrangement for making uniform the illuminance distribution on the surface being illuminated is disclosed in Japanese Published Patent Application, Publication No. 13686/1992.

FIG. 15 is a schematic view of a main portion of an illumination optical system as proposed in the aforementioned Japanese patent application. Denoted in the drawing at LEN is an illumination optical system. Denoted at 60 is a plane of a stop, and denoted at 61–64 are lenses. Denoted at 65 is a surface to be illuminated. Denoted at 66 and 67 are a light ray, of a light flux directed to an on-axis position upon the surface 65, that passes the upper edge of the stop 60 and a light ray of the same light flux that passes the lower edge of the stop 60. Denoted at 68 and 69 are a light ray, of a light flux directed to an outermost off-axis position upon the surface 65, that passes the upper edge of the stop 60 and a light ray of the same light flux that passes the lower edge of the stop 60.

In this optical system, lenses 63 and 64 are movable along an optical axis to change the illuminance distribution on the surface 65. Also, lenses 61 and 62 are movable to correct or compensate for changes of numerical aperture and range of illumination, for example, caused with movement of the lenses 63 and 64.

Particularly, the numerical aperture of an illumination optical system is an important factor that has a large influence on the resolution of a projected pattern, when the system is used in an exposure apparatus for the manufacture of semiconductor devices. Thus, it is desirable to make the ratio between the value of this numerical aperture on the axis upon the surface 65 and the value of it off the axis as close to 1 as possible (hereinafter, this ratio will be referred to as the "N.A. ratio"). Making this N.A. ratio close to 1 corresponds to making the ratio between $\sin\theta c$ and $(\sin\theta u + \sin\theta 1)/2$ in FIG. 15 close to 1.

Here, $\theta c$ is the angle of the light ray, of the light flux impinging on the on-axis position upon the surface 65, that passes the upper or lower edge of the stop 60, the angle being defined with respect to a normal to the surface 65. $\theta u$ is the angle of the light ray 78, of the light flux impinging on an off-axis position upon the surface 65, that passes the upper edge of the stop 60, the angle being defined with respect to a normal to the surface 65. $\theta 1$ is the angle of the light ray 79, of the light flux impinging on an off-axis position upon the surface 65, that passes the lower edge of the stop 60, the angle being defined with respect to a normal to the surface 65. Further, there are cases wherein it is desired to make the ratio of $\sin\theta u$ and $\sin\theta 1$ close to 1.

Thus, regarding the numerical aperture of an illumination optical system on the side thereof facing the surface to be illuminated, it is desired that, at both of the on-axis position and off-axis position, the value thereof is optimized and that, even if the illuminance distribution changes, the value is substantially maintained.

SUMMARY OF THE INVENTION

It is an object of the present invention to provide an illumination system with which the value of the numerical aperture can be optimized and can be maintained easily and also with which the illuminance distribution on the surface to be illuminated can be changed as desired.

It is another object of the present invention to provide an exposure apparatus with which the illuminance distribution on the surface of a mask or a substrate to be exposed can be changed as desired.

In accordance with an aspect of the present invention, there is provided an illumination system wherein an optical system for projecting light to a surface to be illuminated includes an optical element which has a paraxial power of substantially zero and which has an aspherical surface, the optical element being movable along an optical axis of the optical system when the illuminance distribution is to be changed.

Said optical system may comprise an optical system for irradiating the surface to be illuminated, with light from a light source such as a light source for exposure.

Said optical system may include a lens element which is movable along the optical axis of the optical system when the illuminance distribution upon the surface to be illuminated is to be changed.

Said optical system may include an optical integrator, wherein the movable optical element may be disposed between the optical integrator and the surface to be illuminated.

The aspherical surface of the optical element may be set so as to define substantially the same numerical aperture for on-axis illumination light and off-axis illumination light.

The optical element may have a flat surface on the side facing the light source, and the surface of the optical element facing the surface to be illuminated may comprise an aspherical surface.

The aspherical surface of the optical element may be provided by a refraction surface or a diffraction surface.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIG. 1 is a schematic sectional view of a main portion of an illumination optical system used in an illumination system, according to a first embodiment of the present invention.

FIG. 2 is an aberration graph of the illumination optical system in the illumination system, according to the first embodiment of the present invention.

FIG. 7 is a schematic sectional view of a main portion of an illumination optical system used in an illumination system, according to a fourth embodiment of the present invention.

FIG. 8 is an aberration graph of the illumination optical system in the illumination system, according to the fourth embodiment of the present invention.

FIG. 12 is a schematic view of a projection exposure apparatus according to an embodiment of the present invention.

FIG. 13 is a flow chart of a device manufacturing method according to an embodiment of the present invention.

DESCRIPTION OF THE PREFERRED EMBODIMENTS

Figure 3:
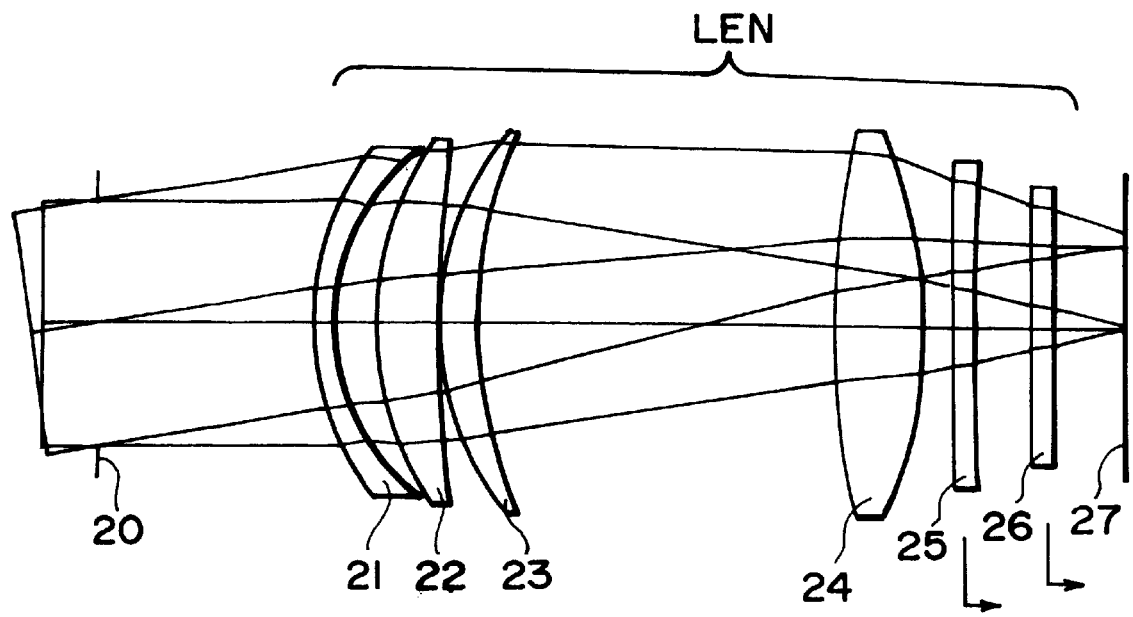
FIG. 3 is a schematic sectional view of a main portion of an illumination optical system used in an illumination system, according to a second embodiment of the present invention.
Figure 4:
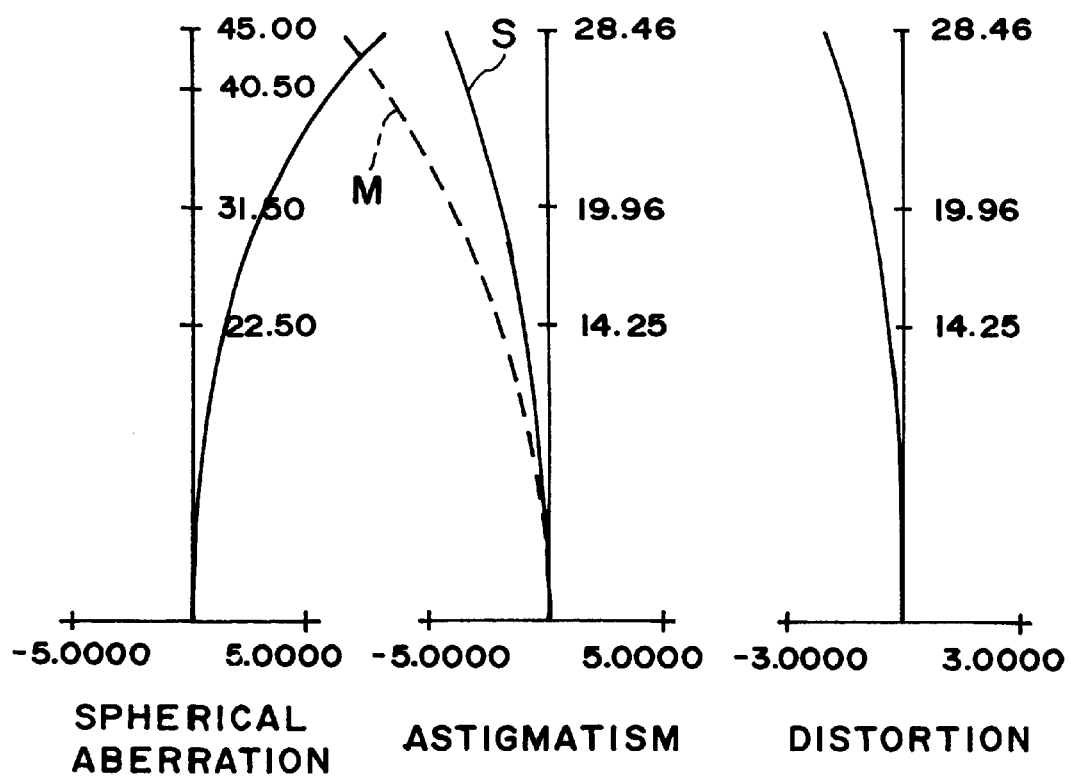
FIG. 4 is an aberration graph of the illumination optical system in the illumination system, according to the second embodiment of the present invention.

FIG. 1 is a schematic sectional view of an illumination optical system for an illumination system according to a first embodiment of the present invention and, more particularly, according to a numerical example 1 to be described later. FIG. 2 is an aberration graph for explaining aberrations of the illumination optical system of FIG. 1.

Denoted in FIG. 1 at LEN is the illumination optical system comprising four fixed lenses 11, 12, 13 and 14 and two lenses 15 and 16 which are movable along the direction of an optical axis. Denoted at 10 is a stop, and denoted at 17 is the surface to be illuminated. The illumination optical system LEN is adapted to collect the light beam, of the light flux from a light source (not shown), that has passed the stop 10, to illuminate the surface 17. Here, in the illumination optical system, the lenses (optical elements) 15 and 16 are displaced along the optical axis direction to change the illuminance distribution upon the surface 17, in various ways. The position of the stop 10 is close to the position of a light exit surface of an optical integrator of the illumination system or to the position a plane optically conjugate with the light exit surface of the integrator. The position of the surface 17 to be illuminated corresponds to the position of a member such as a reticle, for example, or to the position of a field stop such as a masking blade, for example. The same positional relation applies to embodiments to be described later.

The lens 15 is moved toward the stop 10 side as depicted by an arrow, when the illuminance at an off-axis portion of the surface 17 is to be made higher as compared with that on the on-axis portion of the surface 17. In such a case, the lens 16 is moved toward the surface 17 side as depicted by an arrow. When the illuminance adjustment is to be done inversely, the lenses 15 and 16 are moved inversely. This applies also to embodiments to be described later. The lens 16 has a flat surface at a side thereof facing the stop 10. It has an aspherical surface at the surface 17 side, having no power component (refractive power). Here, "no power" means that the power around the axis (i.e., paraxial power) is so small that no imaging function is provided. The same applies also to embodiments to be described later.

Figure 11:
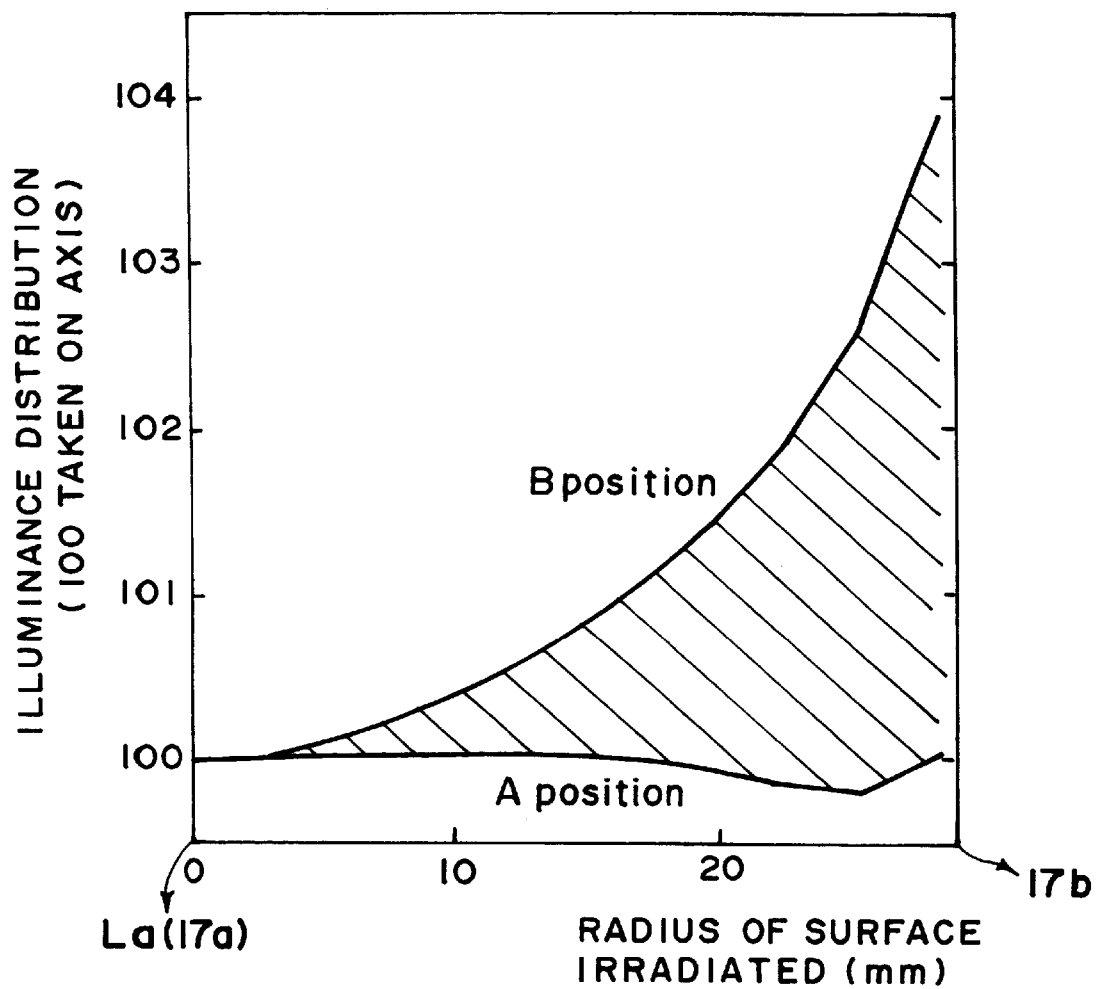
FIG. 11 is a graph for explaining an illuminance distribution on the surface being illuminated with an illumination system according to the present invention.

FIG. 11 is a graph for explaining changes in the illuminance distribution upon the surface 17, when in the present embodiment, the lenses 15 and 16 are displaced along the optical axis direction. In this graph, the axis of the abscissa corresponds the radius while taking the position of the optical axis La upon the surface 17 as a center. The axis of the ordinate corresponds to illuminance at an off-axis portion, when the illuminance at the center 17a is taken as a reference 100. The positions of the lenses 15 and 16 are variable. The position of each of the lenses 15 and 16 in a state wherein the illuminance at the off-axis portion 17b becomes smallest is referred to as "position A". The position of each of the lenses 15 and 16 in a state in which the illuminance at the off-axis portion 17b becomes largest is referred to as "position B". By moving the lenses 15 and 16 within the range between the opposite ends of the illuminance distribution as defined by these positions, the illuminance distribution can take an arbitrary value within the range as illustrated with hatching in FIG. 11.

In this embodiment, the lenses 15 and 16 are moved successively so that the illuminance distribution changes uninterruptedly within the range illustrated by hatching. FIG. 2 illustrates longitudinal aberrations in the case of "position A", as an example.

FIGS. 3, 5, 7 and 9 are schematic sectional views of main portions of illumination optical systems LEN of illumination systems, respectively, according to second, third, fourth and fifth embodiments of the present invention, respectively, and, more particularly, according to numerical examples 2, 3, 4 and 5, respectively, to be described later. FIGS. 4, 6, 8 and 10 are aberration graphs, respectively, of numerical examples 2–5 of the illumination optical systems LEN, constituting the illumination systems of the second to fifth embodiments of the present invention.

In the second embodiment shown in FIG. 3, denoted at 20 is a stop, and denoted at 27 is the surface to be illuminated. Denoted at 21, 22, 23 and 24 are fixed lenses, and denoted at 25 and 26 are lenses which are movable both toward the surface 17 side as depicted by arrows, with the change from "position A" to "position B" as described hereinbefore. The surface of each of the lenses 25 and 26 at the stop 20 side is flat, and the other lens surface at the surface 27 side comprises an aspherical surface having no power component.

Figure 5:
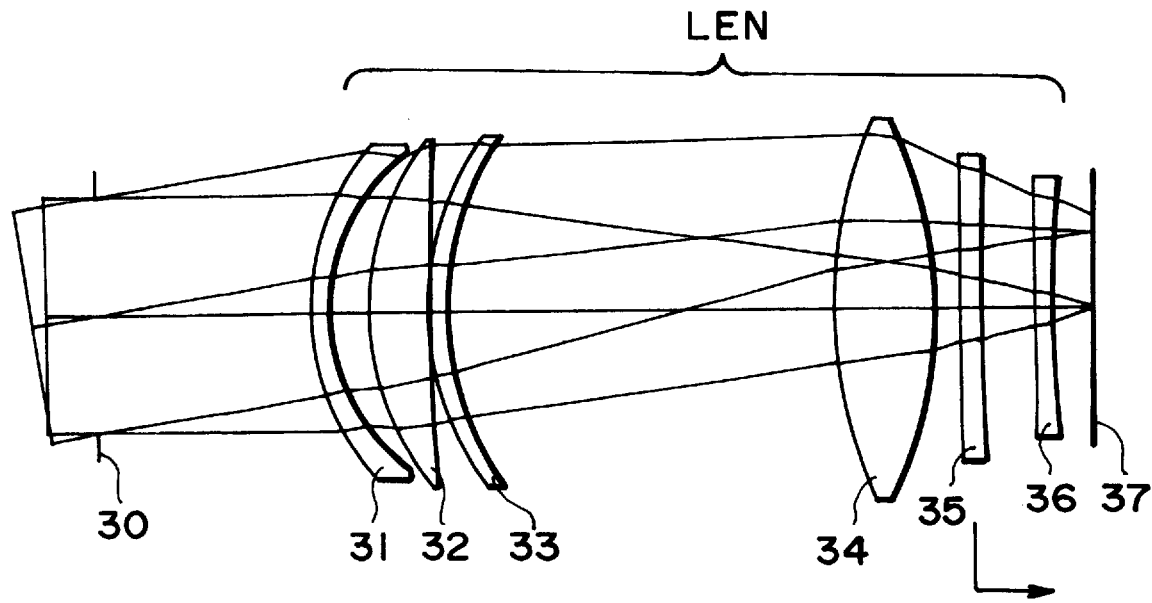
FIG. 5 is a schematic sectional view of a main portion of an illumination optical system used in an illumination system, according to a third embodiment of the present invention.
Figure 6:
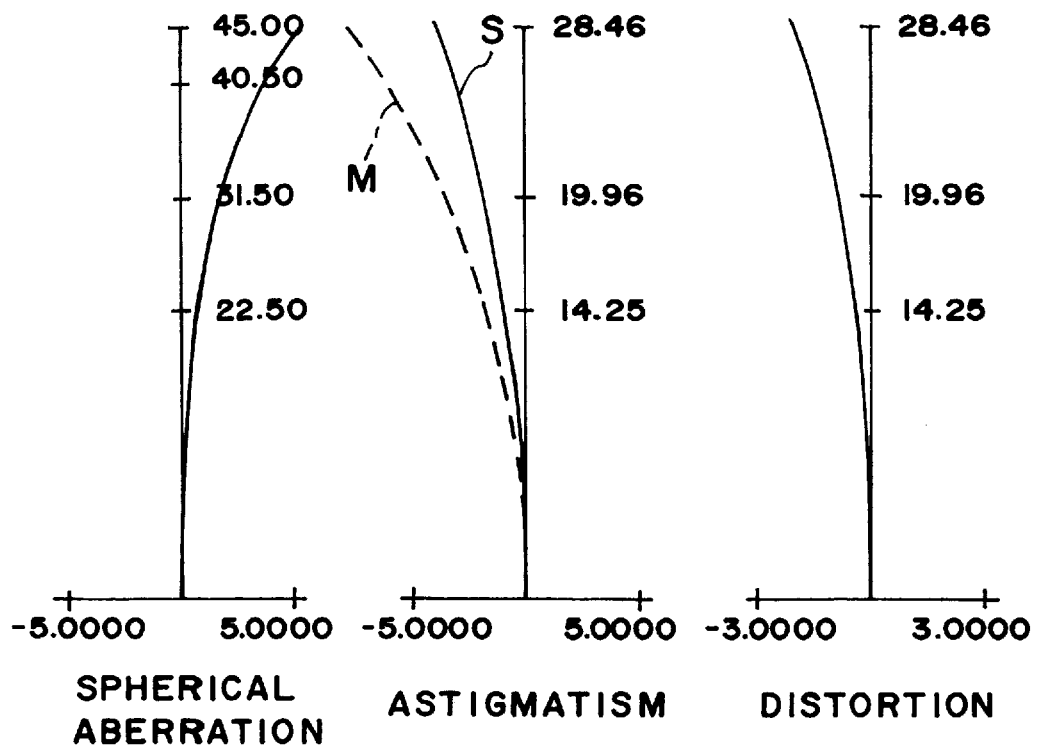
FIG. 6 is an aberration graph of the illumination optical system in the illumination system, according to the third embodiment of the present invention.

In the third embodiment shown in FIG. 5, denoted at 30 is a stop, and denoted at 37 is the surface to be illuminated. Denoted at 31, 32, 33, 34 and 36 are fixed lenses, and denoted at 35 is a lens which is movable toward the surface 37 with the change from "position A" to "position B" as described hereinbefore. The surface of the lens 35 at the stop 30 side is flat, and the other surface thereof at the surface 37 side comprises an aspherical surface having no power component.

In this embodiment, the illuminance distribution can be changed as desired by moving only one lens. During the lens movement, any change in the remaining optical characteristics is suppressed as much as possible.

In the fourth embodiment shown in FIG. 7, a diffraction type aspherical surface element is used in place of an ordinary aspherical lens. Denoted at 40 is a stop, and denoted at 47 is the surface to be illuminated. Denoted at 41, 42, 43 and 44 are fixed lenses, and denoted at 45 is a lens which is movable toward the stop 40 side as depicted by an arrow, with an increase in off-axis illuminance on the surface 47 relative to the on-axis illuminance. Denoted at 46 is a diffractive optical element which is an optical element movable toward the surface 17 side as depicted by an arrow, in a similar manner. The surface thereof facing the stop 40 side is flat. The other surface of the lens 46 at the surface 47 side has been fine-processed into a Fresnel lens shape, and it has no power component.

The procedure of designing an optical system, including a diffractive optical element, used in the present embodiment, will now be explained. An example of designing an optical system having a diffractive optical element is disclosed in Japanese Laid-Open Patent Application, Laid-Open No. 331941/1994 or Laid-Open No. 331942/1994.

Similarly, while taking an ultra-high index lens as a diffractive optical element, designing can be performed in accordance with an ordinary lens automatic designing program. Designing may be done while taking an ultra-high index lens as having a refractivity 10001 and as an aspherical lens defined in accordance with equation (1) below.

$$z = h^2/R/[1 + \{1-(1+k)(h/R)^2\}^{0.5}] + Bh^4 + Ch^6 + Dh^8 \quad (1)$$

Here, z is the coordinate with respect to the optical axis direction, h is the distance from the optical axis, R is the radius of curvature, k is a conic constant, B is a fourth-order (quartic) aspherical coefficient, C is a sixth-order (sextic) aspherical coefficient, and D is an eighth-order aspherical coefficient. The pitch d of the diffractive optical element can be determined by equation (2), below, based on equation (1).

$$d = m\lambda/\{(n-1)dz/dh\} \quad (2)$$

Here, m is the diffraction order, and $\lambda$ is the wavelength. The distribution of pitch d of the diffractive optical element may be determined in accordance with equation (2). Further, while the embodiments to be described below use an aspherical term of up to the eighth order, the aspherical term is not limited to this. If necessary, a higher order aspherical term, such as the tenth order or higher, may be used.

Figure 9:
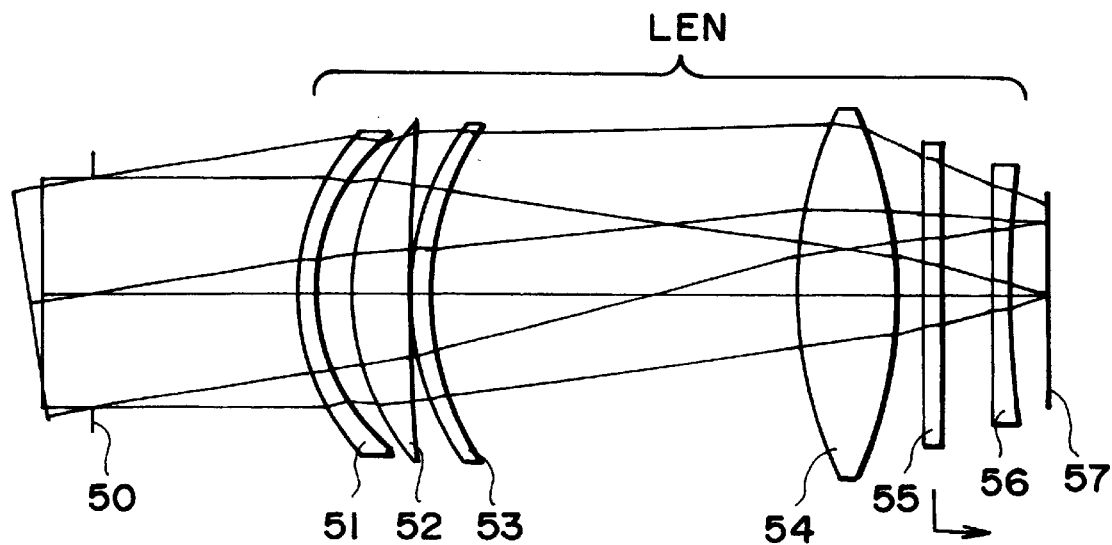
FIG. 9 is a schematic sectional view of a main portion of an illumination optical system used in an illumination system, according to a fifth embodiment of the present invention.
Figure 10:
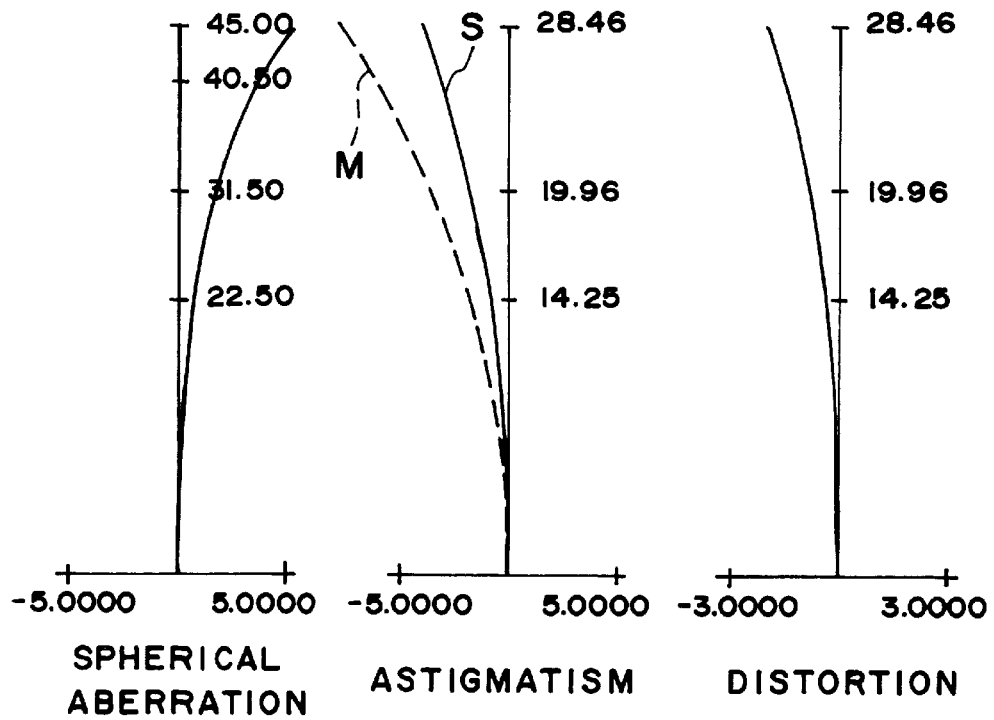
FIG. 10 is an aberration graph of the illumination optical system in the illumination system, according to the fifth embodiment of the present invention.

In the fifth embodiment shown in FIG. 9, denoted at 50 is a stop, and denoted at 57 is the surface to be illuminated. Denoted at 51, 52, 53, 54 and 56 are fixed lenses. Denoted at 55 is a diffractive optical element (aspherical surface lens) which is movable toward the surface 57 side with the change from "position A" to "position B" as described hereinbefore. The surface of the lens 57 at the stop 50 side is flat, and the other surface at the surface 57 side has been fine-processed into a Fresnel lens shape such that it has no power component.

In this embodiment, the illuminance distribution can be changed as desired by moving only one lens. During the lens movement, any change in the remaining optical characteristics is suppressed as much as possible.

Now, numerical examples 1–5 of illumination optical systems LEN used in the first to fifth embodiments, described hereinbefore, will be explained. The aspherical surface shape used in each of the first to fifth embodiments may be defined similarly in accordance with equation (1), used for the ultra-high index lens. In numerical examples 1–5, the illumination optical system LEN comprises a negative lens 11 of meniscus shape having its convex surface facing to the stop side, a positive lens 12 of meniscus shape having its convex surface facing to the stop side, a negative lens 13 of meniscus shape having its convex surface facing to the stop side, a positive lens 14 having convex lens surfaces at its opposite sides, and two optical elements including an optical element (lens or diffractive optical element) having no power and being movable along the optical axis. With this structure, good aberration correction is ensured. Also, a movable optical element capable of changing the illuminance distribution while substantially unchanging the numerical aperture of the optical system at the illuminated surface side or the range of illumination, is provided. Further, the aforementioned N.A. ratio or σ ratio is set substantially equal to 1.

$\lambda = 248.2$ nm, entrance pupil diameter: $\phi 90$, surface to be illuminated: $\phi 57$ mm

[Numerical Example 1]

| SURFACE NUMBER | CURVATURE RADIUS | SURFACE SPACING | REFRACTIVITY | |
|---|---|---|---|---|
| 1 | | 69.1 | | |
| 2 | 82.114 | 8.5 | 1.508456 | |
| 3 | 70.000 | 20.0 | | |
| 4 | 106.227 | 22.0 | 1.508456 | |
| 5 | 583.427 | 1.0 | | |
| 6 | 123.864 | 9.0 | 1.508456 | |
| 7 | 114.431 | 140.2 | | |
| 8 | 133.538 | 39.5 | 1.508456 | |
| 9 | −214.674 | d9:variable | | |
| 10 | 364.832 | 8.5 | 1.508456 | |
| 11 | 193.139 | d11:variable | | |
| 12 | ∞ | 8.0 | 1.508456 | |
| 13 | ∞ | d13:variable | | * aspherical |

| | "POSITION A" | "POSITION B" |
|---|---|---|
| Focal Distance | 191.215 | 191.661 |
| d9 | 3.7 | 1.9 |
| d11 | 10.6 | 27.4 |
| d13 | 43.9 | 28.9 |

ASPHERICAL SURFACE COEFFICIENT OF SURFACE 13

| k | 0.0 |
|---|---|
| B | 2.67464e-7 |
| C | −4.37472e-11 |
| D | 1.28068e-14 |

[Numerical Example 2]

| SURFACE NUMBER | CURVATURE RADIUS | SURFACE SPACING | REFRACTIVITY |
|---|---|---|---|
| 1 | | 80.0 | |
| 2 | 104.153 | 8.0 | 1.508456 |
| 3 | 78.090 | 16.239 | |
| 4 | 117.760 | 23.0 | 1.508456 |
| 5 | 549.967 | 0.5 | |
| 6 | 110.038 | 14.0 | 1.508456 |

-continued

λ = 248.2 nm, entrance pupil diameter: φ90,
surface to be illuminated: φ57 mm

| | | | |
|---|---|---|---|
| 7 | 162.457 | 132.935 | |
| 8 | 318.463 | 33.5 | 1.508456 |
| 9 | −170.079 | d9:variable | |
| 10 | ∞ | 8.0 | 1.508456 |
| 11 | ∞ | d11:variable | * aspherical |
| 12 | ∞ | 8.5 | 1.508456 |
| 13 | ∞ | d13:variable | * aspherical |

| | "POSITION A" | "POSITION B" |
|---|---|---|
| Focal Distance | 191.791 | 191.791 |
| d9 | 10.6 | 29.2 |
| d11 | 21.4 | 5.6 |
| d13 | 25.6 | 22.8 |

| ASPHERICAL SURFACE COEFFICIENT OF SURFACE 11 | | ASPHERICAL SURFACE COEFFICIENT OF SURFACE 13 | |
|---|---|---|---|
| k | 0.0 | k | 0.0 |
| B | 2.14813e-7 | B | −7.90449e-8 |
| C | −6.32785e-12 | C | −9.49817e-11 |
| D | −8.10179e-15 | D | 5.85307e-14 |

[Numerical Example 3]

| SURFACE NUMBER | CURVATURE RADIUS | SURFACE SPACING | REFRACTIVITY | |
|---|---|---|---|---|
| 1 | | 83.1 | | |
| 2 | 97.613 | 8.0 | 1.508456 | |
| 3 | 76.000 | 13.66 | | |
| 4 | 103.000 | 23.0 | 1.508456 | |
| 5 | 785.867 | 0.5 | | |
| 6 | 114.768 | 8.0 | 1.508456 | |
| 7 | 119.135 | 146.49 | | |
| 8 | 174.495 | 39.5 | 1.508456 | |
| 9 | −172.705 | d9:variable | | |
| 10 | ∞ | 8.0 | 1.508456 | |
| 11 | ∞ | d11:variable | | * aspherical |
| 12 | −4968.018 | 7.0 | 1.508456 | |
| 13 | 407.594 | 15.4 | | |

| | "POSITION A" | "POSITION B" |
|---|---|---|
| Focal Distance | 190.026 | 190.026 |
| d9 | 9.9 | 25.2 |
| d11 | 20.6 | 5.3 |

ASPHERICAL SURFACE COEFFICIENT OF SURFACE 11

| | |
|---|---|
| k | 0.0 |
| B | 2.13327e-7 |
| C | −7.47283e-12 |
| D | −8.31892e-15 |

[Numerical Example 4]

| SURFACE NUMBER | CURVATURE RADIUS | SURFACE SPACING | REFRACTIVITY |
|---|---|---|---|
| 1 | | 69.1 | |
| 2 | 82.114 | 8.5 | 1.508456 |
| 3 | 70.000 | 20.0 | |
| 4 | 106.227 | 22.0 | 1.508456 |
| 5 | 583.427 | 1.0 | |
| 6 | 123.864 | 9.0 | 1.508456 |
| 7 | 114.431 | 140.2 | |
| 8 | 133.538 | 39.5 | 1.508456 |
| 9 | −214.674 | d9:variable | |
| 10 | 364.832 | 8.5 | 1.508456 |
| 11 | 193.139 | d11:variable | |
| 12 | ∞ | 8.0 | 1.508456 |
| 13 | ∞ | 0.0 | |
| 14 | ∞ | 0.0 | |
| 15 | ∞ | d15:variable | |

12: substrate for diffractive optical element
14: diffractive optical element (ultra-high index lens)

| | "POSITION A" | "POSITION B" |
|---|---|---|
| Focal Distance | 191.215 | 191.661 |
| d9 | 3.7 | 1.9 |
| d11 | 10.6 | 27.4 |
| d15 | 43.9 | 28.9 |

ASPHERICAL SURFACE COEFFICIENT OF SURFACE 14
(Diffractive Optical Element)

| | |
|---|---|
| k | 0.0 |
| B | −1.34182e-11 |
| C | 2.00329e-15 |
| D | −5.91522e-19 |

[Numerical Example 5]

| SURFACE NUMBER | CURVATURE RADIUS | SURFACE SPACING | REFRACTIVITY |
|---|---|---|---|
| 1 | | 83.1 | |
| 2 | 97.613 | 8.0 | 1.508456 |
| 3 | 76.000 | 13.66 | |
| 4 | 103.000 | 23.0 | 1.508456 |
| 5 | 785.867 | 0.5 | |
| 6 | 114.768 | 8.0 | 1.508456 |
| 7 | 119.135 | 146.49 | |
| 8 | 174.495 | 39.5 | 1.508456 |
| 9 | −172.705 | d9:variable | |
| 10 | ∞ | 8.5 | 1.508456 |
| 11 | ∞ | 0.0 | |
| 12 | ∞ | 0.0 | 1.508456 |
| 13 | ∞ | d13:variable | |
| 14 | −4968.018 | 7.0 | 1.508456 |
| 15 | 407.594 | 15.4 | |

10: substrate for diffractive optical element
12: diffractive optical element (ultra-high index lens)

| | "POSITION A" | "POSITION B" |
|---|---|---|
| Focal Distance | 190.026 | 190.026 |
| d9 | 9.9 | 25.2 |
| d13 | 20.6 | 5.3 |

ASPHERICAL SURFACE COEFFICIENT OF SURFACE 12
(Diffractive Optical Element)

| | |
|---|---|
| k | 0.0 |
| B | −1.13037e-11 |
| C | 9.17261e-16 |
| D | 2.32611e-19 |

FIG. 12 is a schematic view of a main portion of an embodiment of the present invention wherein the illumination system is incorporated into a projection exposure apparatus for the manufacture of semiconductor devices such as LSIs, or microdevices such as CCDs, liquid crystal panels or magnetic heads, for example. In FIG. 12, light from a light source 70 is transformed by a beam shaping optical system 71 into a desired diameter and, after this, the light is collected upon a light entrance surface 72a of an optical integrator 72. The optical integrator 72 comprises a plurality of small lenses (fly's-eye lenses) arrayed two-dimensionally. The light incident on the light entrance surface 72a of the optical integrator 72 forms secondary light sources of a uniform light distribution characteristic, at a light exit surface 72b of the optical integrator 72.

Denoted at 77 is a stop, and denoted at 73 is an illumination optical system (LEN) such as described hereinbefore. This illumination optical system functions to collect the light passing the stop 77 and illuminates an aperture of a field stop (masking blade) 74. Denoted at 75a and 75b are stop imaging lenses, and denoted at 76 is the surface of a mask (the surface to be illuminated). A circuit pattern is formed on the surface of the mask.

The field stop 74 functions to determine the range of illumination. The size and shape of the aperture of this field stop are variable. The imaging lenses 75a and 75b function to image the aperture of the stop 74 upon the surface of the mask 76. In order to change the illuminance distribution on the mask surface 76, an aspherical surface optical element within the illumination optical system 73 is moved along the optical axis to change the illuminance distribution upon the plane of the aperture of the stop 74. This change in illuminance distribution is then transferred onto the mask surface 76 by means of the imaging lenses 75a and 75b. By this, the illuminance distribution on the mask surface 76 is adjusted.

Denoted at 78 is a projection optical system for projecting the pattern of the mask surface 76 onto the surface of a wafer 79. The wafer 79 is placed on an X-Y stage. Through stepwise motion of the wafer in accordance with a step-and-repeat or step-and-scan procedure, shot areas on the wafer surface are exposed sequentially. After completion of the exposure process, the exposed wafer 79 is then processed by a known development procedure, through which semiconductor devices or other microdevices are produced.

Next, an embodiment of a microdevice manufacturing method using a projection exposure apparatus as described above, will be explained.

FIG. 13 is a flow chart of a procedure for the manufacture of microdevices such as semiconductor chips (e.g., ICs or LSIs), liquid crystal panels, or CCDs, for example. Step 1 is a design process for designing a circuit of a semiconductor device. Step 2 is a process for making a mask on the basis of the circuit pattern design. Step 3 is a process for preparing a wafer by using a material such as silicon. Step 4 is a wafer process which is called a preprocess wherein, by using the so prepared mask and wafer, circuits are practically formed on the wafer through lithography. Step 5 subsequent to this is an assembling step which is called a post-process wherein the wafer having been processed by step 4 is formed into semiconductor chips. This step includes an assembling (dicing and bonding) process and a packaging (chip sealing) process. Step 6 is an inspection step wherein an operation check, a durability check and so on for the semiconductor devices provided by step 5 are carried out. With these processes, semiconductor devices are completed and they are shipped (step 7).

Figure 14:
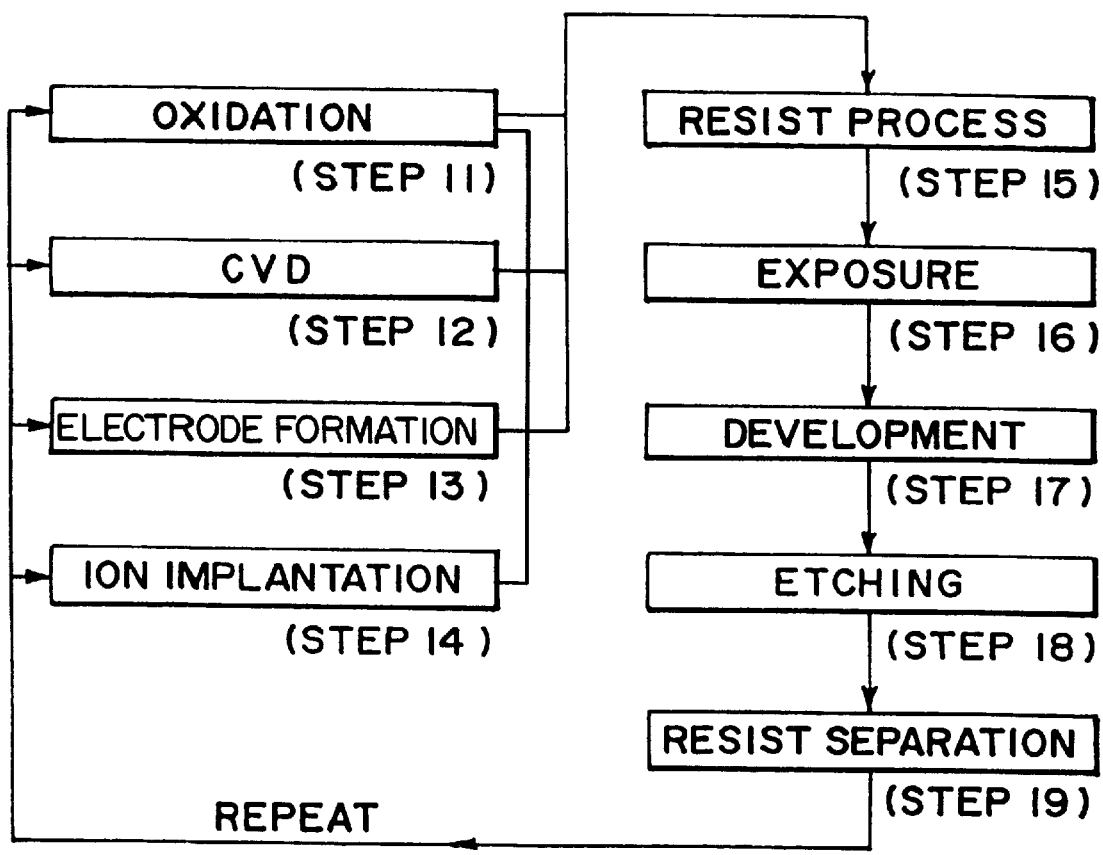
FIG. 14 is a flow chart for explaining details of a wafer process, included in the flow chart of FIG. 13.
Figure 15:
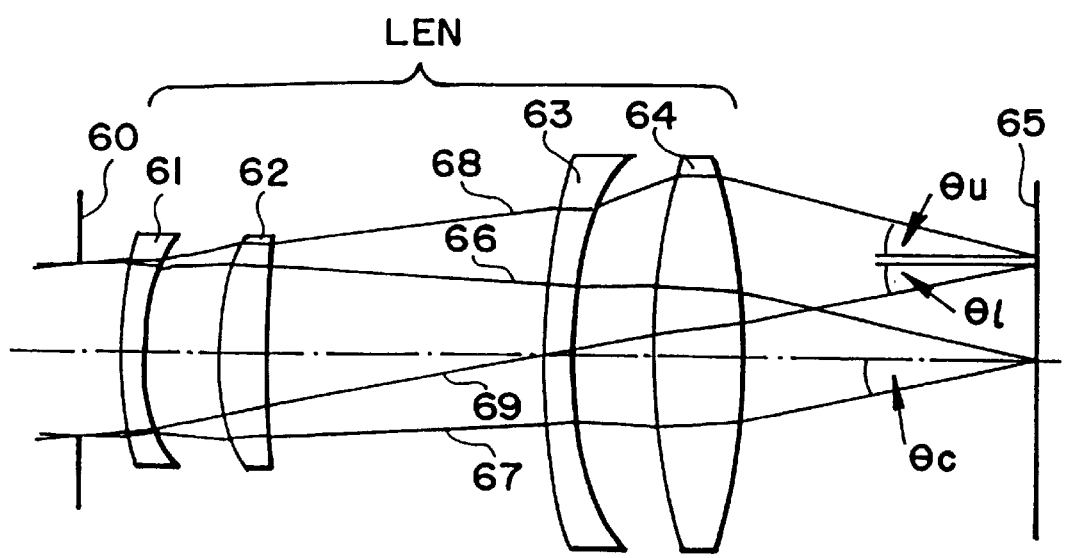
FIG. 15 is a schematic sectional view of a main portion of an illumination system of a known type.

FIG. 14 is a flow chart showing details of the wafer process. Step 11 is an oxidation process for oxidizing the surface of a wafer. Step 12 is a CVD process for forming an insulating film on the wafer surface. Step 13 is an electrode forming process for forming electrodes upon the wafer by vapor deposition. Step 14 is an ion implanting process for implanting ions to the wafer. Step 15 is a resist process for applying a resist (photosensitive material) to the wafer. Step 16 is an exposure process for printing, by exposure, the circuit pattern of the mask on the wafer through the exposure apparatus described above. Step 17 is a developing process for developing the exposed wafer. Step 18 is an etching process for removing portions other than the developed resist image. Step 19 is a resist separation process for separating the resist material remaining on the wafer after being subjected to the etching process. By repeating these processes, circuit patterns are superposedly formed on the wafer.

With these processes, high density microdevices can be manufactured.

In accordance with the embodiments of the present invention as described hereinbefore, components of an illumination optical system for illuminating a surface to be illuminated are set appropriately, such that changes in optical characteristics of an illumination optical system are suppressed as much as possible, and that the illuminance distribution can be changed uninterruptedly without causing a decrease of illuminance on the surface to be illuminated. Further, the N.A. ratio or σ ratio described hereinbefore can be made close to 1. Thus, the present invention assures an illumination system that provides an optimum illuminance distribution constantly.

Also, by using such an illumination system, a suitable illuminance distribution can be formed on the surface of a wafer. Thus, a projection exposure apparatus capable of projecting a pattern of a reticle onto a wafer with high resolution can be provided. Further, based on such a projection exposure apparatus, a device manufacturing method is provided.

While the invention has been described with reference to the structures disclosed herein, it is not confined to the details set forth and this application is intended to cover such modifications or changes as may come within the purposes of the improvements or the scope of the following claims.

What is claimed is:

1. An illumination system, comprising:
   a light source for emitting light; and
   an optical system for projecting the light from said light source to a surface to be illuminated, said optical system comprising an optical element having a paraxial power of substantially zero and having an aspherical surface, wherein said optical element is movable along an optical axis when an illuminance distribution on the surface to be illuminated is to be changed.

2. A system according to claim 1, wherein the aspherical surface of said optical element provides substantially the same numerical aperture for on-axis illumination light and for off-axis illumination light.

3. A system according to claim 1, wherein said optical element has a flat surface at a side facing said light source, and another surface of said optical element facing the surface to be illuminated comprises the aspherical surface.

4. A system according to claim 1, wherein the aspherical surface is defined by one of a refractive surface and a diffractive surface.

5. A system according to claim 1, wherein said optical system further comprises a lens element which is movable along the optical axis when the illuminance distribution upon the surface to be illuminated is to be changed.

6. A system according to claim 1, wherein said optical system further comprises an optical integrator, and wherein said movable optical element is disposed between said optical integrator and the surface to be illuminated.

7. A system according to claim 6, wherein the aspherical surface of said optical element provides substantially the same numerical aperture for on-axis illumination light and for off-axis illumination light.

8. A system according to claim 6, wherein said optical element has a flat surface at a side facing said light source, and another surface of said optical element facing the surface to be illuminated comprises the aspherical surface.

9. A system according to claim 6, wherein the aspherical surface is defined by one of a refractive surface and a diffractive surface.

10. A system according to claim 6, wherein said optical system further comprises a lens element which is movable along the optical axis when the illuminance distribution upon the surface to be illuminated is to be changed.

11. A system according to claim 6, wherein said optical integrator comprises a lens array.

12. A system according to claim 11, wherein said lens array comprises a fly's-eye lens.

13. An illumination system for providing a variable illuminance distribution on a surface to be illuminated, said system comprising:

an optical system for projecting light to the surface to be illuminated, said optical system comprising an optical element having a paraxial power of substantially zero and having an aspherical surface, wherein said optical element is movable along an optical axis when the illuminance distribution on the surface to be illuminated is to be changed.

14. A system according to claim 13, wherein the aspherical surface of said optical element provides substantially the same numerical aperture for on-axis illumination light and for off-axis illumination light.

15. An exposure apparatus for illuminating a mask, said exposure apparatus comprising:

an illumination system comprising:
a light source for emitting light; and
an optical system for projecting the light from said light source to a surface to be illuminated, said optical system comprising an optical element having a paraxial power of substantially zero and having an aspherical surface, wherein said optical element is movable along an optical axis when an illuminance distribution on the surface to be illuminated is to be changed and said optical element exposes a substrate with a pattern of the mask.

16. An apparatus according to claim 15, further comprising a projection optical system for projecting the pattern of the mask, illuminated with said illumination system, onto the substrate.

17. An apparatus according to claim 15, wherein the substrate is exposed in accordance with a step-and-repeat procedure.

18. An apparatus according to claim 15, wherein the substrate is exposed in accordance with a step-and-scan procedure.

19. An exposure apparatus for illuminating a mask, said exposure apparatus comprising:

an illumination system for providing a variable illuminance distribution on a surface to be illuminated, said illumination system comprising an optical system for projecting light to the surface to be illuminated, said optical system comprising an optical element having a paraxial power of substantially zero and having an aspherical surface, wherein said optical element is movable along an optical axis when the illuminance distribution on the surface to be illuminated is to be changed, and said optical element exposes a substrate with a pattern of the mask.

20. An apparatus according to claim 19, further comprising a projection optical system for projecting the pattern of the mask, illuminated with said illumination system onto the substrate.

21. An apparatus according to claim 19, wherein the substrate is exposed in accordance with a step-and-repeat procedure.

22. An apparatus according to claim 19, wherein the substrate is exposed in accordance with a step-and-scan procedure.

23. A device manufacturing method comprising:

providing a light source for emitting light;
projecting light from the light source to a surface to be illuminated, using an optical system of an exposure apparatus, the optical system comprising an optical element having a paraxial power of substantially zero and having an aspherical surface, wherein the optical element is movable along an optical axis when an illuminance distribution on the surface to be illuminated is to be changed; and
transferring a device pattern onto a substrate by use of the exposure apparatus.

24. A device manufacturing method comprising:

providing an illumination system for providing a variable illuminance distribution on a surface to be illuminated, the system comprising an optical system of an exposure apparatus;
projecting light to the surface to be illuminated, using the optical system, the optical system comprising an optical element having a paraxial power of substantially zero and having an aspherical surface, wherein the optical element is movable along an optical axis when the illuminance distribution on the surface to be illuminated is to be changed; and
transferring a device pattern onto a substrate by use of the exposure apparatus.

* * * * *

UNITED STATES PATENT AND TRADEMARK OFFICE
CERTIFICATE OF CORRECTION

PATENT NO. : 5,991,088

DATED : November 23, 1999

INVENTOR : SATORU MIZOUCHI

It is certified that error appears in the above-identified patent and that said Letters Patent is hereby corrected as shown below:

ON THE COVER PAGE:
At item [56], References Cited, "FOREIGN PATENT DOCUMENTS",
"4-13686  11/1986  Japan." should read
--4-13686  11/1992  Japan.--.

COLUMN 4:
Line 2, "position" should read --position of--; and
Line 24, "when" should read --when,--.

Signed and Sealed this

Second Day of January, 2001

Attest:

Q. TODD DICKINSON

*Attesting Officer*   *Commissioner of Patents and Trademarks*